United States Patent
Sengupta et al.

(10) Patent No.: US 6,727,535 B1
(45) Date of Patent: Apr. 27, 2004

(54) FERROELECTRIC VARACTOR WITH BUILT-IN DC BLOCKS

(75) Inventors: Louise C. Sengupta, Warwick, MD (US); Steven C. Stowell, Columbia, MD (US); Yongfei Zhu, Columbia, MD (US); Somnath Sengupta, Warwick, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 09/434,433

(22) Filed: Nov. 4, 1999

Related U.S. Application Data

(60) Provisional application No. 60/107,684, filed on Nov. 9, 1998.

(51) Int. Cl.[7] .............................................. H01L 29/76
(52) U.S. Cl. ....................... 257/295; 257/307; 257/522; 257/595
(58) Field of Search ............................. 257/295, 307, 257/522, 595

(56) References Cited

U.S. PATENT DOCUMENTS

| | | | |
|---|---|---|---|
| 4,490,772 A | * 12/1984 | Blickstein | .................... 361/281 |
| 4,740,716 A | 4/1988 | Silverman | |
| 4,906,947 A | 3/1990 | Hart et al. | |
| 5,032,805 A | 7/1991 | Elmer et al. | |
| 5,219,827 A | * 6/1993 | Higaki et al. | .................. 505/1 |
| 5,307,033 A | 4/1994 | Koscica et al. | |

(List continued on next page.)

FOREIGN PATENT DOCUMENTS

| | | |
|---|---|---|
| EP | 0 293 212 A2 | 11/1988 |
| GB | 2 298 523 A1 | 9/1996 |
| JP | 3-203118 | * 9/1991 |
| JP | 8-124785 A | * 5/1996 |
| WO | WO 93/08578 | * 4/1993 |
| WO | WO 94/13028 | 6/1994 |

OTHER PUBLICATIONS

A. Kozyrev et al., "Ferroelectric Films: Nonlinear Properties and Applications in Microwave Devices", *IEEE MTT-S Digest*, XP-000822132, WEIF-54, May 5, 1998, pp. 985-988.

*Primary Examiner*—Nathan J. Flynn
*Assistant Examiner*—Ahmed N. Sefer
(74) *Attorney, Agent, or Firm*—Robert P. Lenart; James S. Finn; William J. Tucker

(57) ABSTRACT

A voltage tunable dielectric varactor includes a tunable ferroelectric layer and first and second non-tunable dielectric layers. First and second electrodes positioned adjacent to the tunable ferroelectric layer form a tunable capacitor. A third electrode is positioned adjacent to the first non-tunable dielectric layer such that the third and first electrodes and the first non-tunable dielectric layer form a first blocking capacitor. A fourth electrode is positioned adjacent to the second non-tunable dielectric layer such that the fourth and second electrodes and the second non-tunable dielectric layer form a second blocking capacitor. The first and second electrodes can be positioned on a surface of the tunable ferroelectric layer opposite the generally planar surface of the substrate, with the first and second electrodes being separated to form a gap. The first and second non-tunable dielectric layers can also be positioned on the generally planar surface of the substrate. The third electrode can be positioned on the surface of the first non-tunable dielectric layer opposite the generally planar surface of the substrate such that the third and first electrodes form a second gap. The fourth electrode can be positioned on the surface of the second non-tunable dielectric layer opposite the generally planar surface of the substrate such that the fourth and second electrodes form a third gap.

8 Claims, 3 Drawing Sheets

U.S. PATENT DOCUMENTS

| | | | |
|---|---|---|---|
| 5,472,935 A | | 12/1995 | Yandrofski et al. |
| 5,561,407 A | | 10/1996 | Koscica et al. |
| 5,576,564 A | * | 11/1996 | Satoh et al. .................. 257/295 |
| 5,640,042 A | | 6/1997 | Koscica et al. |
| 5,721,194 A | * | 2/1998 | Yandrofski et al. ......... 505/210 |
| 5,726,608 A | | 3/1998 | Arlin |
| 5,745,335 A | | 4/1998 | Watt |
| 5,757,612 A | * | 5/1998 | Acosta et al. ............. 361/321.4 |
| 5,830,591 A | * | 11/1998 | Sengupta et al. ............ 428/701 |
| 5,862,034 A | * | 1/1999 | Sato et al. ................ 361/321.5 |
| 6,377,142 B1 | * | 4/2002 | Chiu et al. ................... 333/238 |
| 6,677,142 B1 | * | 4/2002 | Chiu et al. ................... 333/328 |
| 6,404,614 B1 | * | 6/2002 | Zhu et al. .................... 361/277 |
| 6,563,153 B2 | * | 5/2003 | Wikborg et al. ............. 257/295 |

* cited by examiner

`US 6,727,535 B1`

FERROELECTRIC VARACTOR WITH BUILT-IN DC BLOCKS

CROSS REFERENCE TO RELATED PATENT APPLICATION

This application claims the benefit of U.S. Provisional Patent Application No. 60/ 107,684, filed Nov. 9, 1998.

FIELD OF INVENTION

The present invention relates generally to voltage tunable varactors with associated DC blocking capacitors.

BACKGROUND OF INVENTION

Varactors are voltage tunable capacitors in which the capacitance is dependent on a voltage applied thereto. This property can find applications in electrically tuning radio frequency (RF) circuits, such as filters, phase shifters, and so on. The most commonly used varactor is semiconductor diode varactor, which has the advantages of high tunability and low tuning voltage, but suffers low Q, low power handling capability, and limited capacitance range. A new type of varactor is a ferroelectric varactor capacitance is tuned by varying the dielectric constant of a ferroelectric material by changing the bias voltage. Ferroelectric varactors have high Q, high power handling capacity, and high capacitance range.

One ferroelectric varactor is disclosed in U.S. Pat. No. 5,640,042 entitled "Thin Film Ferroelectric Varactor" by Thomas E. Koscica et al. That patent discloses a planar ferroelectric varactor, which includes a carrier substrate layer, a high temperature superconducting metallic layer deposited on the substrate, a lattice matching, a thin film ferroelectric layer deposited on the metallic layer, and a plurality of metallic conductors disposed on the ferroelectric layer and in contact with radio frequency (RF) transmission lines in tuning devices. Another tunable capacitor using a ferroelectric element in combination with a superconducting element is disclosed in U.S. Pat. No. 5,721,194. Tunable varactors that utilizes a ferroelectric layer, and various devices that include such varactors are also disclosed in U.S. patent application Ser. No. 09/419,126, entitled "Voltage Tunable Varactors And Tunable Devices Including Such Varactors", filed Oct. 15, 1999, and assigned to the same assignee as the present invention.

When using such varactors in various devices, it is necessary to insert DC blocking capacitors in the RF transmission line to isolate the DC bias voltage from the other parts of RF system. These DC blocks on the transmission line may result in additional insertion loss to the RF system, and inconvenience in the design and construction of an RF system.

There is a need for varactors with reduced DC block insertion loss, but with high tunability, for use in the VHF, UHF, microwave and other tunable circuits, such as filters, phase shifters, voltage controlled oscillators and so on.

SUMMARY OF INVENTION

A voltage tunable dielectric varactor assembly constructed in accordance with this invention includes a tunable ferroelectric layer and first and second non-tunable dielectric layers. First and second electrodes positioned adjacent to the tunable ferroelectric layer form a tunable capacitor. The first and second electrodes are also positioned adjacent to the first and second non-tunable layers, respectively. A third electrode is positioned adjacent to the first non-tunable dielectric layer such that the third and first electrodes and the first non-tunable dielectric layer form a first blocking capacitor. A fourth electrode is positioned adjacent to the second non-tunable dielectric layer such that the fourth and second electrodes and the second non-tunable dielectric layer form a second blocking capacitor.

In one embodiment, the voltage tunable dielectric varactor includes a substrate having a generally planar surface and a tunable ferroelectric layer positioned on the generally planar surface of the substrate. First and second electrodes are positioned on a surface of the tunable ferroelectric layer opposite the generally planar surface of the substrate, with the first and second electrodes being separated to form a first gap. First and second non-tunable dielectric layers are also positioned on the generally planar surface of the substrate. A third electrode is positioned on the surface of the first non-tunable dielectric layer opposite the generally planar surface of the substrate such that the third and first electrodes form a second gap. A fourth electrode is positioned on the surface of the second non-tunable dielectric layer opposite the generally planar surface of the substrate such that the fourth and second electrodes form a third gap.

In another embodiment, the voltage tunable dielectric varactor includes a tunable ferroelectric layer and first and second non-tunable dielectric layers. The tunable layer is positioned between first and second electrodes to form a tunable capacitor. The first non-tunable layer is positioned between the first electrode and a third electrode to form a first blocking capacitor. The second non-tunable layer is positioned between the second electrode and a fourth electrode to form a second blocking capacitor.

Ferroelectric varactor assemblies of the present invention can be used to produce a phase shift in various microwave devices, and in other devices such as tunable filters.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE PREFERRED EMBODIMENTS

Figure 1:
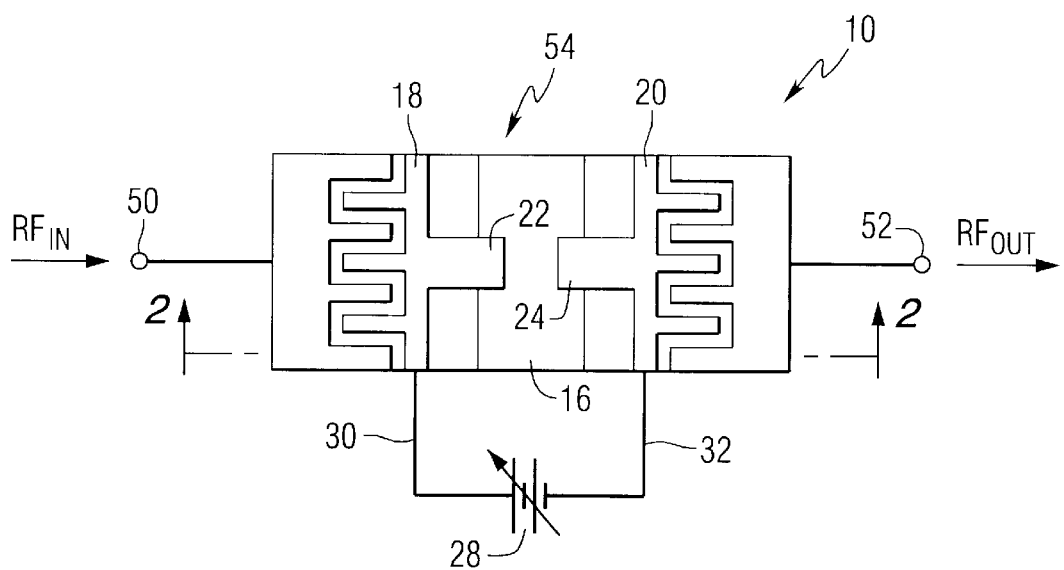
FIG. 1 is a top view of a planar varactor assembly with built-in DC blocking capacitors constructed in accordance with the invention.
Figure 2:
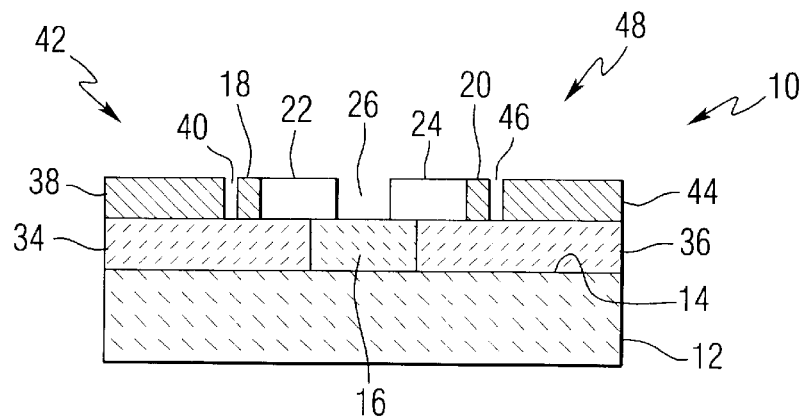
FIG. 2 is a cross sectional view of the varactor assembly of FIG. 1, taken along line 2—2.

Referring to the drawings, FIGS. 1 and 2 are top and cross sectional views of a varactor assembly 10 constructed in accordance with this invention. The varactor assembly includes a substrate 12 having a generally planar top surface 14. A tunable ferroelectric layer 16 is positioned adjacent to the top surface of the substrate. Metal electrodes 18 and 20 are positioned on top of the ferroelectric layer. The electrodes 18 and 20 are shaped to have projections 22 and 24. The ends of these projections form a gap 26 on the surface of the tunable ferroelectric layer. The combination of electrodes 18 and 20, and tunable ferroelectric layer 16 form a tunable capacitor 54. The capacitance of the tunable capacitor can be changed by applying a bias voltage to the electrodes 18 and 20.

In the preferred embodiment, the substrate 12 is comprised of a material having a relatively low permittivity such as MgO, Alumina, $LaAlO_3$, Sapphire, or a ceramic. For the purposes of this invention, a low permittivity is a permittivity of less than about 30. In the preferred embodiment, the tunable ferroelectric layer 16 is comprised of a material having a permittivity in a range from about 20 to about 2000, and having a tunability in the range from about 10% to about 80% at a bias voltage of about 10 V/$\mu$m. The tunable ferroelectric layer can be comprised of Barium-Strontium Titanate, $Ba_xSr_{1-x}TiO_3$ (BSTO), where x can range from zero to one, or BSTO-composite ceramics. Examples of such BSTO composites include, but are not limited to: BSTO-MgO, $BSTO-MgAl_2O_4$, $BSTO-CaTiO_3$, $BSTO-MgTiO_3$, $BSTO-MgSrZrTiO_6$, and combinations thereof The dielectric film of the ferroelectric capacitor may be deposited by screen printer, laser ablation, metal-organic solution deposition, sputtering, or chemical vapor deposition techniques. The tunable layer in one preferred embodiment has a dielectric permittivity greater than 100 when subjected to typical DC bias voltages, for example, voltages ranging from about 5 volts to about 300 volts. The gap width must be optimized to increase ratio of the maximum capacitance $C_{max}$ to the minimum capacitance $C_{min}$ ($C_{max}/C_{min}$) and increase the quality factor (Q) of the device. The width of this gap has the most influence on the varactor parameters. The optimal width, g, will be determined by the width at which the device has maximum $C_{max}/C_{min}$ and minimal loss tangent.

A controllable voltage source 28 is connected by lines 30 and 32 to electrodes 18 and 20. This voltage source is used to supply a DC bias voltage to the ferroelectric layer, thereby controlling the permittivity of the layer. The varactor assembly further includes first and second non-tunable dielectric layers 34 and 36 positioned adjacent to the generally planar surface of the substrate 12 and on opposite sides of the tunable ferroelectric layer 16 Electrode 18 extends over a portion of the top surface of non-tunable material 34. Electrode 38 is positioned adjacent a top surface of non-tunable layer 34 such that a gap 40 is formed between electrodes 18 and 38. The combination of electrodes 18 and 38 and non-tunable layer 34 forms a first DC blocking capacitor 42. The varactor assembly also includes an RF input 50 and an RF output 52.

Electrode 44 is positioned adjacent a top surface of non-tunable layer 36 such that a gap 46 is formed between electrodes 20 and 44. The combination of electrodes 20 and 44 and non-tunable layer 36 forms a second DC blocking capacitor 48. The dielectric films of the DC blocking capacitors may be deposited by screen printer, laser ablation, metal-organic solution deposition, sputtering, or chemical vapor deposition techniques.

An RF input 50 is connected to electrode 38. An RF output 52 is connected to electrode 44. The RF input and output are connected to electrodes 38 and 44, respectively, by soldered or bonded connections. The non-tunable dielectric layers 34 and 36, in the DC blocking capacitors 42 and 48, are comprised of a high dielectric constant material, such as BSTO composite. The DC blocking capacitors 42 and 48 are electrically connected in series with the tunable capacitor 54 to isolate the DC bias from the outside of the varactor assembly 10. To increase the capacitance of the two DC blocking capacitors 42 and 48 the electrodes have an interdigital arrangement as shown in FIG. 1.

In the preferred embodiments, the varactors may use gap widths of 5–50 $\mu$m. The thickness of the ferroelectric layer ranges from about 0.1 $\mu$m to about 20 $\mu$m. A sealant can be inserted into the gaps to increase breakdown voltage. The sealant can be any non-conducting material with a high dielectric breakdown strength to allow the application of high voltage without arcing across the gap, for example, epoxy or polyurethane.

Figure 3:
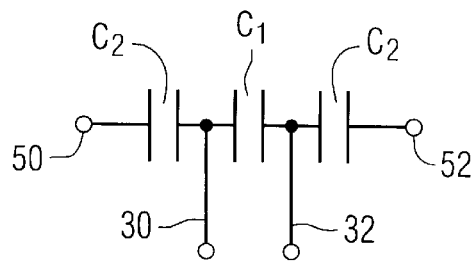
FIG. 3 is an equivalent circuit of the varactor with built-in DC block capacitors of FIGS. 1 and 2.

The equivalent circuit of the varactor assemblies of this invention is 5 shown in FIG. 3. The circuit is comprised of a tunable capacitor $C_1$ connected in series to two non-tunable DC block capacitors $C_2$ have equal capacitance in this example. Therefore, the resultant capacitor $C_t$ of the varactor assembly is expressed as $$\frac{1}{C_t} = \frac{1}{C_1} + \frac{2}{C_2} \text{ or,} \qquad (1)$$

$$\frac{C_t}{C_1} = \frac{1}{1 + \frac{2C_1}{C_2}} \qquad (2)$$

Here $C_1$ is the capacitance of tunable capacitor, and $C_2$ is the capacitance of DC block capacitors. In the case of:

$$C_1 \ll C_2 \qquad (3)$$

Equation (2) gives:

$$C_t \approx C_1 \qquad (4)$$

The tunability of the resultant capacitor is related to that of the capacitor Cl. The tunability, t, of material can be defined as:

$$t = \frac{1}{\varepsilon_r}\frac{d\varepsilon_r}{dE} \qquad (5)$$

where $\varepsilon_\gamma$ is the dielectric constant of the material, and E is strength of applied field. In the case of a capacitor where tunable material is used, often the capacitance C of the capacitor varies linearly with the dielectric constant, that is:

$$C = a\varepsilon_r \qquad (6)$$

where a is a capacitor parameter constant related to the geometrical structure, such as area, thickness and so on. The tunability can then be expressed as:

$$t = \frac{1}{\varepsilon_r}\frac{d\varepsilon_r}{dE} = \frac{1}{C}\frac{dC}{dE} \qquad (7)$$

If $C_1$ is a tunable capacitor with tunability $t_1$ and $C_2$ is a non-tunable capacitor, the resultant tunability $t_t$ of the varactor assembly can be obtained from Equation (1) and Equation (7)

$$\frac{t_t}{C_t} = \frac{t_1}{C_1} \qquad (8)$$

Using Equation (2), Equation (8) can be re mitten so that:

$$\frac{t_t}{t_1} = \frac{C_t}{C_1} = \frac{1}{1 + \frac{2C_1}{C_2}} \qquad (9)$$

here $t_t$ is the resultant tunability of the varactor assembly. Equation (1) shows that:

$$C_t < C_1 \qquad (10)$$

since both $C_1$ and $C_2$ are both positive numbers. Therefore, from Equation (9), $$t_t < t_1 \qquad (11)$$

If the condition of Equation (3) is applied ($C_1 << C_2$), $$t_t \approx t_1 \qquad (12)$$

Figure 4:
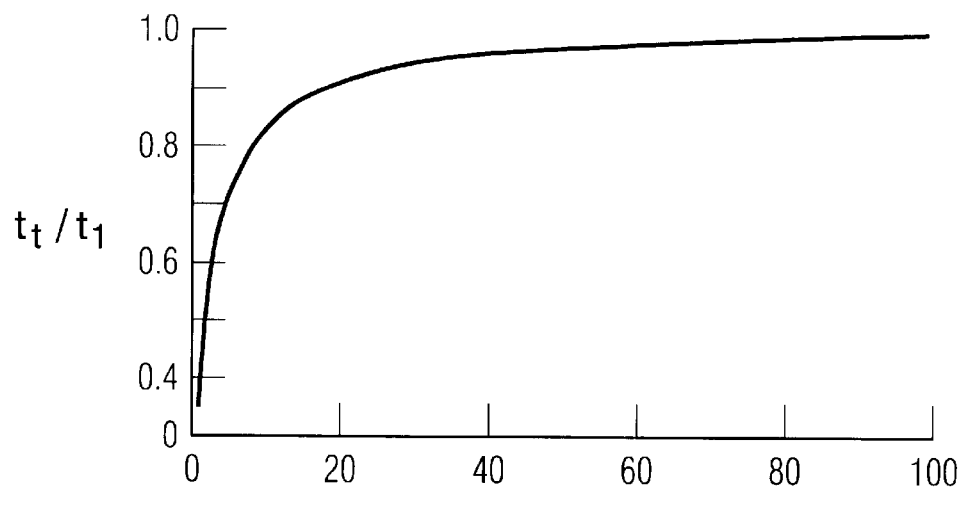
FIG. 4 is a graph of the tunability versus capacitance ratio for a varactor assembly constructed in accordance with the invention.

FIG. 4 shows the relationship of Equation (9) graphically. For example, it can be seen that at:

$$\frac{C_2}{C_1} = 20, \text{ we have } \frac{t_t}{t_1} = \frac{C_t}{C_1} = 0.91.$$

$$\text{and at } \frac{C_2}{C_1} = 40, \text{ we have } \frac{t_t}{t_1} = \frac{C_t}{C_1} = 0.95.$$

Therefore, if $C_2 >> C_1$, the resultant capacitance $C_t$ and tunability $t_t$ are mostly determined by the tunable capacitor $C_1$. Very little additional insertion loss is incurred through the integration of the DC blocking capacitors in the present invention, since the capacitance of the DC blocking capacitors is much higher than the capacitance of the varactor portion of the assembly. The insertion loss of the varactor assembly of the present invention results primarily from the tunable ferroelectric capacitor and its connections, since the capacitance of the tunable ferroelectric capacitor is much smaller than that of DC blocking capacitors.

Figure 5:
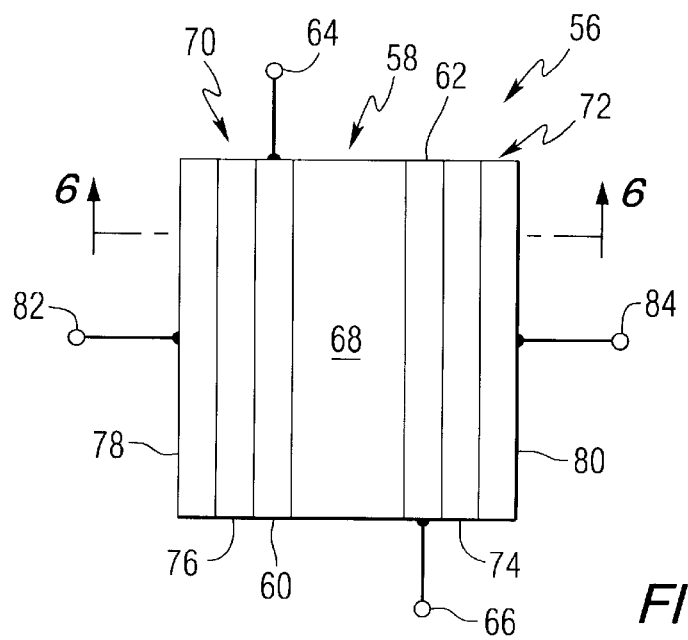
FIG. 5 is a top view of a varactor assembly with built-in DC blocking capacitors constructed in accordance with another embodiment of the invention.
Figure 6:
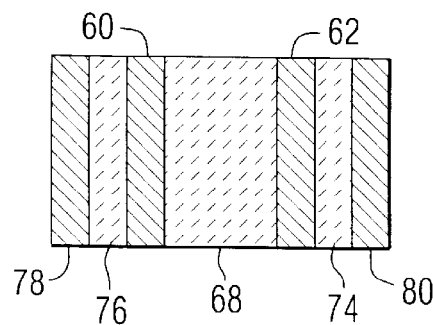
FIG. 6 is a cross sectional view of the varactor assembly of FIG. 5, taken along line 6—6.

FIGS. 5 and 6 are top and cross sectional views of a varactor assembly 56 with planar capacitor structure. In FIGS. 5 and 6, a capacitor 58 is a tunable parallel-plate capacitor with DC bias metallic layer electrodes 60 and 62, which have bias terminations 64 and 66, respectively. The tunable material 68 in the capacitor 58 may be BSTO-based or related materials in the styles of bulk, tape, or thin film. DC block capacitors 70 and 72 are parallel-plate capacitors, which are connected in series to the tunable capacitor 58, respectively. The dielectric material 74 and 76 used in capacitors 70 and 72 is non-tunable material with high dielectric constant in the styles of bulk, tape or film. The capacitance of the DC blocking capacitors 70 and 72 should be at least 20 times higher than that of the tunable capacitor 58 by properly selection of dielectric constant of the dielectric material and the thickness of the dielectric layers. Electrodes 78 and 80 of the varactor assembly 56 are connected to a radio frequency (RF) signal though terminals 82 and 84. In order to satisfy the condition of $C_2 >> C_1$ in Equation (3), higher dielectric constant and thinner non-tunable layers 74 and 76, compared to the tunable layer 68, are chosen for the DC blocking capacitors 70 and 72 to increase the capacitance.

Figure 7:
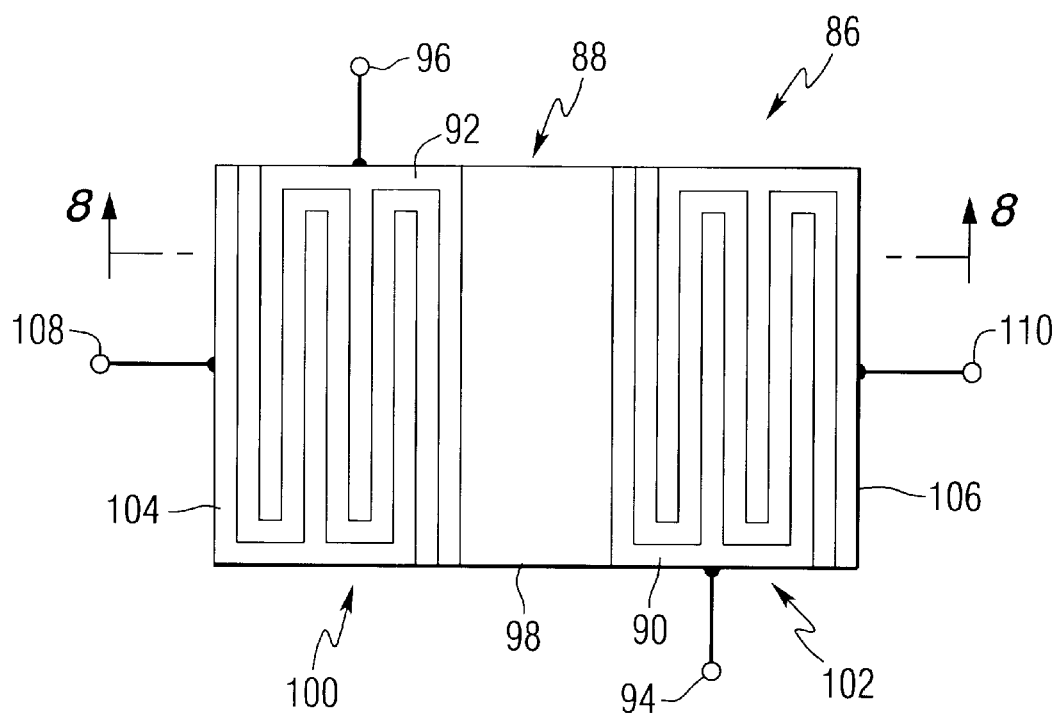
FIG. 7 is a top view of a varactor assembly with built-in DC blocking capacitors constructed in accordance with another embodiment of the invention.
Figure 8:
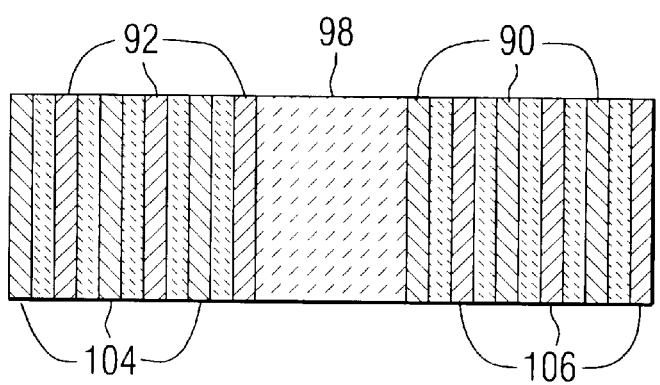
FIG. 8 is a cross sectional view of the varactor assembly of FIG. 7, taken along line 8—8.

FIGS. 7 and 8 show a third embodiment of a varactor assembly 86 constructed in accordance with the present invention. The structure of varactor assembly 86 is similar to that of varactor assembly 56. However, multilayer capacitors are used as the DC blocking capacitors in varactor assembly 86 to replace the single layer DC blocking capacitors in varactor assembly 56 to increase the capacitance. The dielectric materials in this structure may be tape, thin or thick films. In FIGS. 7 and 8, a capacitor 88 is a tunable capacitor with DC bias metallic layer electrodes 90 and 92, which have bias terminations 94 and 96, respectively. The tunable material 98 in the capacitor 88 may be BSTO- based or related materials. The multilayer DC blocking capacitors 100 and 102 are connected in series to the tunable capacitor 88, respectively. The dielectric material used in capacitors 100 and 102 is non-tunable material with a high dielectric constant. With this embodiment, the capacitance of the DC blocking capacitor 100 and 102 should be at least 40 times higher than that of the tunable capacitor 88 by proper selection of the dielectric material, the thickness of the dielectric layer, and the number of dielectric layers. Electrodes 104 and 106 of the varactor assembly 86 are connected to the RF transmission lines through the electrode terminations 108 and 110.

A ferroelectric varactor assembly with built-in DC block (s) has been described, in which low loss and high tunability materials are used. The built-in DC blocking capacitors make the varactor much easier to use in RF circuits, and eliminate the insertion loss caused by conventional DC blocking capacitors when conventional varactor is used. The low loss and high tunability materials may be Barium-strontium titanate, $Ba_xSr_{1-x}TiO_3$ (BSTO), where x is less than 1, or BSTO- based composites. These high quality materials may significantly improve the varactor performance of the present invention. The ferroelectric varactor may be made of bulk, thin film, or thick film ferroelectiic materials.

Accordingly, the present invention, by utilizing built-in DC blocking capacitors and high quality tunable ferroelectric materials, provides a high performance of ferroelectric varactor assembly, elimination of conventional DC block insertion loss, and significant convenience for RF circuit design and processing. This invention has many practical applications and many other modifications of the disclosed devices may be obvious to those skilled in the art without departing from the spirit and scope of this invention as defined by the following claims.

What is claimed is:

1. A voltage tunable dielectric varactor assembly comprising:

a substrate having a generally planar surface;

a tunable ferroelectric layer positioned on the generally planar surface of the substrate;

first and second electrodes positioned on a surface of the tunable ferroelectric layer opposite the generally planar surface of the substrate, said first and second electrodes being separated to form a gap therebetween;

first and second non-tunable dielectric layers positioned on the generally planar surface of the substrate, wherein a portion of the first non-tunable dielectric layer is positioned adjacent to the first electrode, and wherein a portion of the second non-tunable dielectric layer is positioned adjacent to the second electrode;

a third electrode positioned on a surface of the first non-tunable dielectric layer opposite the generally planar surface of the substrate, said third and first electrodes being separated to form a second gap therebetween; and a fourth electrode positioned on a surface of the second non-tunable dielectric layer opposite the generally planar surface of the substrate, said fourth and second electrodes being separated to form a third gap therebetween.

2. A voltage tunable dielectric varactor assembly as recited in claim 1, wherein the capacitance between said first and second electrodes is less that the capacitance between said first and third electrodes by a factor of at least about 20.

3. A voltage tunable dielectric varactor assembly as recited in claim 1, wherein said second and third gaps are interdigital gaps.

4. A voltage tunable dielectric varactor assembly as recited in claim 1, wherein the tunable ferroelectric layer has a permittivity in a range from about 20 to about 2000, and a tunability in a range from about 10% to about 80% at a bias voltage of about 10 V/$\mu$m.

5. A voltage tunable dielectric varactor assembly as recited in claims, wherein the substrate comprises one of the group of: MgO, Alumina, LaAlO$_3$, sapphire, and a ceramic.

6. A voltage tunable dielectric varactor assembly as recited in claim 1, wherein the tunable ferroelectric layer comprises one of:

a tunable ferroelectric thick film;

a tunable ferroelectric bulk ceramic; and a tunable ferroelectric thin film.

7. A voltage tunable dielectric varactor assembly as recited in claim 1, wherein the tunable ferroelectric includes an RF input and an RF output for passing an RF signal through the tunable ferroelectric layer in a first direction, and wherein the first gap extends in a second direction substantially perpendicular to the first direction.

8. A voltage tunable dielectric varactor assembly as recited in claim 1, wherein the tunable ferroelectric layer comprises BSTO-MgO, BSTO-MgAl$_2$O$_4$, BSTO-CaTiO$_3$, BSTO-MgTiO$_3$, BSTO-MgSrZrTiO$_6$, or combinations thereof.

* * * * *